US012796399B2

(12) United States Patent
Coppola et al.

(10) Patent No.: US 12,796,399 B2
(45) Date of Patent: Nov. 10, 2026

(54) VACUUM WAFER CHUCK WITH SOLID DIAMOND PINS

(71) Applicant: II-VI Delaware, Inc., Wilmington, DE (US)

(72) Inventors: Jonathan Coppola, Wilmington, DE (US); Nicholas Coombs, Wilmington, DE (US); Jiwen Wang, Wilmington, DE (US); Mike Aghajanian, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 495 days.

(21) Appl. No.: 18/238,737

(22) Filed: Aug. 28, 2023

(65) Prior Publication Data

US 2025/0079226 A1 Mar. 6, 2025

(51) Int. Cl.
*H10P 72/78* (2026.01)
*C04B 35/52* (2006.01)
*H10P 72/76* (2026.01)

(52) U.S. Cl.
CPC .............. *H10P 72/78* (2026.01); *C04B 35/52* (2013.01); *H10P 72/7614* (2026.01); *H10P 72/7624* (2026.01); *C04B 2235/3826* (2013.01); *C04B 2235/427* (2013.01)

(58) Field of Classification Search
CPC ............. H10P 72/7614; H10P 72/7616; C04B 35/573; C04B 2235/427; C04B 2235/428; C04B 2235/3826
See application file for complete search history.

(56) References Cited

U.S. PATENT DOCUMENTS

| | | | | |
|---|---|---|---|---|
| 9,238,207 | B2 * | 1/2016 | Sung | B24B 53/017 |
| 11,584,694 | B2 | 2/2023 | Coppola et al. | |
| 2018/0099379 | A1 | 4/2018 | Mastrobattisto | |
| 2022/0227676 | A1 * | 7/2022 | Coppola | C04B 35/565 |

FOREIGN PATENT DOCUMENTS

| | | |
|---|---|---|
| JP | 2018-517282 A | 6/2018 |
| JP | 2021-517546 A | 7/2021 |
| JP | 2021-171917 A | 11/2021 |

OTHER PUBLICATIONS

European Search Report issued Oct. 9, 2024 for EP Application No. 24161127.6.
Korean Official Communication (translation) issued Dec. 18, 2024 for KR Appliction No. 10-2024-0011064.
Japanese Office Action Appln. No. 2024-005786 dated Feb. 12, 2025.
Japanese Office Action Appln. No. 2024-005786 dated Jun. 26, 2025.

* cited by examiner

*Primary Examiner* — Tyrone V Hall, Jr.
(74) *Attorney, Agent, or Firm* — McAndrews Held & Malloy, Ltd.

(57) ABSTRACT

A reaction-bonded silicon carbide body includes a main body portion free of diamond and one or more discrete elements each formed from a single diamond particle embedded within the main body. The discrete elements may be machined into pins that project from the body for supporting a semiconductor wafer in a vacuum wafer chuck. By localizing diamond only within the discrete elements, the body provides high thermal conductivity and wear resistance where needed while maintaining machinability and reducing cost.

9 Claims, 7 Drawing Sheets

Top-View

VACUUM WAFER CHUCK WITH SOLID DIAMOND PINS

TECHNICAL FIELD

The present disclosure generally relates to a vacuum wafer chuck with solid diamond pins.

BACKGROUND

Aspects of the present disclosure relate to a vacuum wafer chuck with solid diamond pins. Various issues may exist with conventional solutions for a vacuum wafer chuck with solid diamond pins. In this regard, conventional systems and methods for a vacuum wafer chuck with solid diamond pins may be costly, cumbersome, and/or inefficient.

Limitations and disadvantages of conventional systems and methods will become apparent to one of skill in the art, through comparison of such approaches with some aspects of the present methods and systems set forth in the remainder of this disclosure with reference to the drawings.

BRIEF SUMMARY OF THE DISCLOSURE

Shown in and/or described in connection with at least one of the figures, and set forth more completely in the claims are a vacuum wafer chuck with solid diamond pins.

These and other advantages, aspects and novel features of the present disclosure, as well as details of illustrated embodiments thereof, will be more fully understood from the following description and drawings.

BRIEF DESCRIPTION OF THE DRAWINGS

The various features and advantages of the present disclosure may be more readily understood with reference to the following detailed description taken in conjunction with the accompanying drawings, wherein like reference numerals designate like structural elements.

DESCRIPTION

Figure 1:
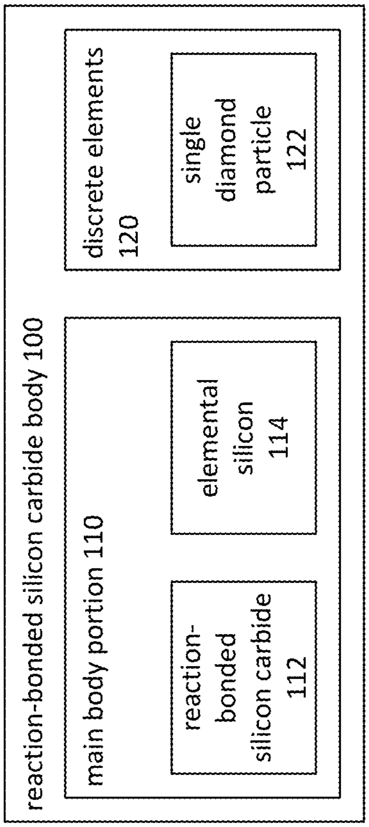
FIG. 1 is a block diagram illustrating a reaction-bonded silicon carbide body, according to some embodiments of the present disclosure.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

Referring now to FIG. 1, there is shown a block diagram that describes a reaction-bonded silicon carbide body 100, according to some embodiments of the present disclosure. In some embodiments, the reaction-bonded silicon carbide body 100 may include a main body portion 110. The reaction-bonded silicon carbide body 100 may also include one or more discrete elements 120 of a dimension, located at least partially within the main body portion 110. The main body portion 110 may include reaction-bonded silicon carbide 112 and elemental silicon 114 without comprising diamond. The one or more discrete elements 120 may also include a single diamond particle 122 of the dimension. Reaction-bonded silicon carbide 112 may surround the diamond particles 122, and elemental silicon 114.

In some embodiments, the main body portion 110 may be configured for use within a vacuum wafer chuck. In some embodiments, the discrete elements 120 may be configured to provide high heat flux directly under a die, without reducing the machinability of the main body portion 110. In some embodiments, the discrete elements 120 may be configured to provide local diamond reinforcement at a wear face, without reducing the machinability of the main body portion 110.

Figure 2:
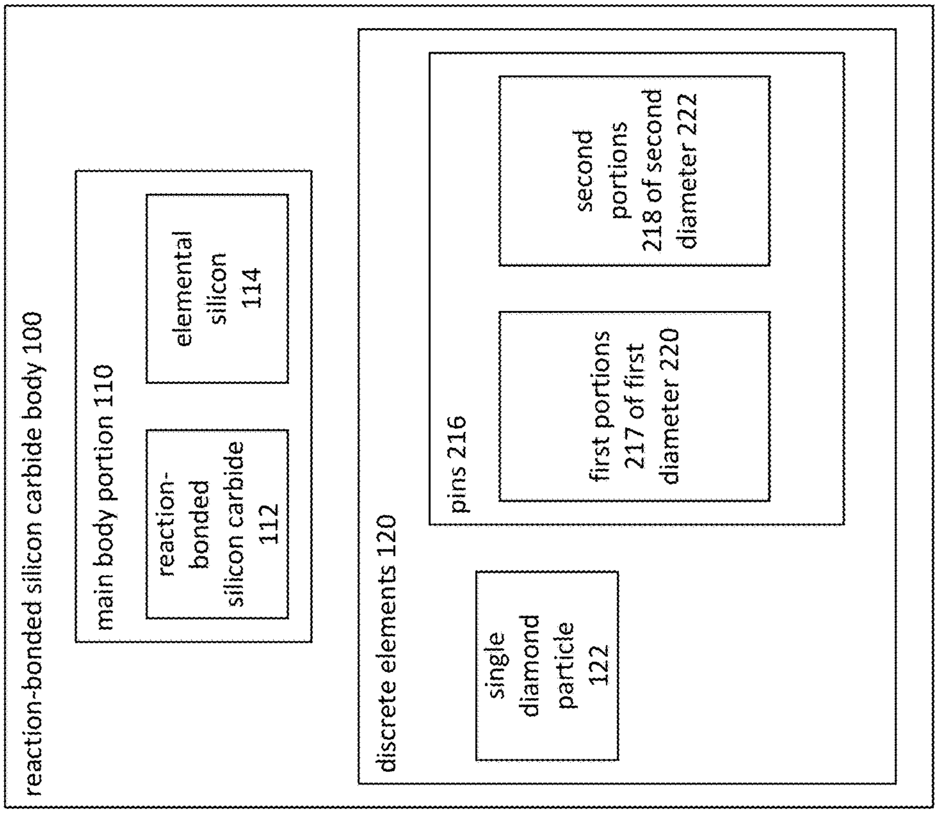
FIG. 2 is a block diagram that further describes the reaction-bonded silicon carbide body 100 from FIG. 1.

FIG. 2 is a block diagram that further describes the reaction-bonded silicon carbide body 100 from FIG. 1, according to some embodiments of the present disclosure. In some embodiments, the one or more discrete elements 120 may include pins 216 for supporting a semiconductor wafer, for example. In some embodiments, the pins 216 may include first portions 217 located within the main body portion 110 and second portions 218 which stand proud above the main body portion 110 and the first portions 217. In some embodiments, the first portions 217 of the pins 216 may comprise a first diameter 220. The second portions 218 may comprise a second diameter 222. The first diameter 220 may be smaller than the second diameter 222, the second (or first) diameter 222 being substantially equal to the dimension.

Figure 3A:
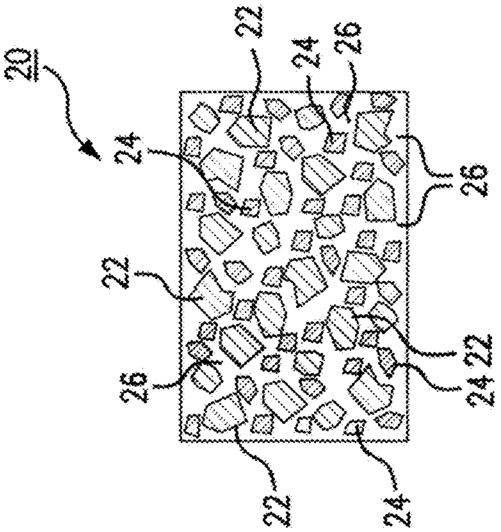
FIG. 3*a* to FIG. 3*d* are cross-sectional views of a reaction-bonded ceramic material 20.
Figure 3B:
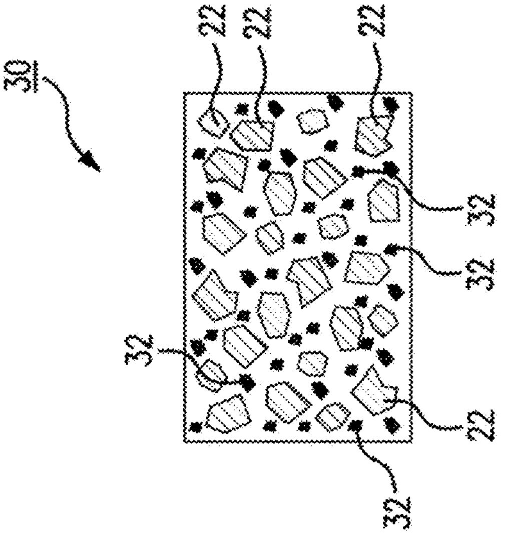
Figure 3C:
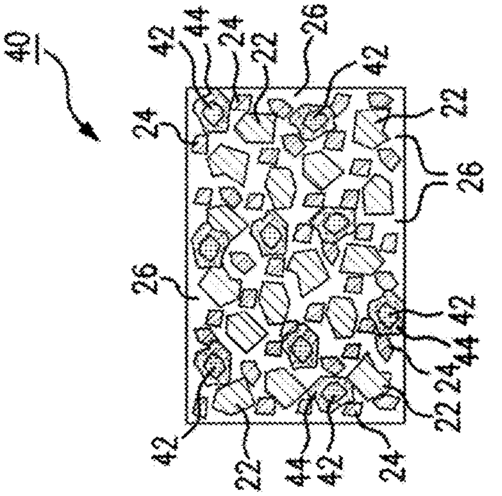
Figure 3D:
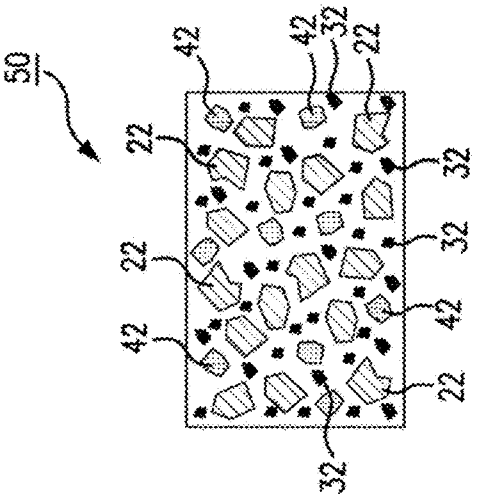

FIG. 3*a* to FIG. 3*d* are cross-sectional views of a reaction-bonded ceramic material 20 which includes ceramic particles 22, reaction-formed silicon carbide (SIC) particles 24, and residual elemental silicon (Si) 26. The ceramic particles 22 may include SiC or boron carbide (B4C). The ceramic material 20 may be produced by performing a reactive infiltration process on a preform 30 (FIG. 3*b*) which comprises the ceramic particles 22 and elemental carbon 32. During the infiltration process, molten Si may infiltrate the preform 30 to form the reaction-formed SiC particles 24. That is, the molten Si may react with the carbon 32 to form additional SiC. Despite the infiltration of Si into the preform 30, the process may result in only a small increase in volume (the increase in volume of the ceramic material 20 compared to that of the preform 30) that may be less than one percent, for example. The ceramic material 20 illustrated in FIG. 3*a* does not contain diamond. FIG. 3*c* is a cross-sectional view of a reaction-bonded ceramic material 40 which comprises reaction-formed SiC particles 24, residual elemental Si 26, diamond particles 42, reaction-formed SiC coatings 44 located on and surrounding the diamond particles 42, and, optionally, ceramic particles 22. The ceramic particles 22, if desired, may include SiC or B4C. The ceramic material 40 may be produced by performing a reactive-infiltration process on a preform 50 (FIG. 3*d*) which may include powder, and which includes the optional ceramic particles 22, elemental carbon 32, and the diamond particles 42. During the reactive-infiltration process, molten Si infiltrates the preform 50 to form the reaction-formed SiC particles 24 and the reaction-formed SiC coatings 44. If desired, the coatings 44 may completely surround the diamond particles 42 such that the coatings 44 appear as halos surrounding the particles 42 in the cross-sectional view of FIG. 3*c*. During the reactive-infiltration process, the molten Si reacts with the carbon 32 to form additional SiC, and the molten Si also reacts with surfaces of the diamond particles 42 to produce the reaction-formed SiC coatings 44. Despite the infiltration of the molten Si into the preform 50, the process may result in only a small increase in volume (the increase in volume of the ceramic material 40 compared to that of the preform 50) that may be less than one percent.

The material 40 illustrated in FIG. 3*c*, which comprises a composite of reaction bonded SiC 24, 44, diamond particles 42 (SiSiC-diamond), may be considered for many high-end applications, because the material 40 may have low thermal expansion, high thermal conductivity, high hardness, high wear resistance, high stiffness, and low coefficient of friction. However, the diamond particles 42 may make the material 40 extremely difficult to machine (cut, grind, and/or shape). Thus, according to the present disclosure, discrete reinforcement elements may be provided for a reaction-bonded SiC body, where the reinforcement elements include the diamond particles 42 while the body, for example main body portion 110, does not contain diamond. According to the present disclosure, the diamond-containing material 40 illustrated in FIG. 3*c* may be located only where needed to provide desired performance. The remainder of the body may be formed of the material 20 illustrated in FIG. 3*a*, which contains reaction-bonded SiC 24 but no diamond, and which is well suited to cost-effective machining.

Diamond has many desirable characteristics for a variety of useful applications. Such characteristics include extremely high hardness for wear resistance, very low coefficient of friction for sliding applications, very high stiffness (Young's modulus) for structural applications, and extreme thermal stability (high thermal conductivity and low coefficient of thermal expansion (CTE)). In accordance with various embodiments of the disclosure, desirable diamond particles may be single crystals and/or polycrystalline crystals. Often, polycrystalline diamond particles may exhibit more uniform properties, e.g. hardness, in different physical directions/planes of the crystal particle.

Figure 4A:
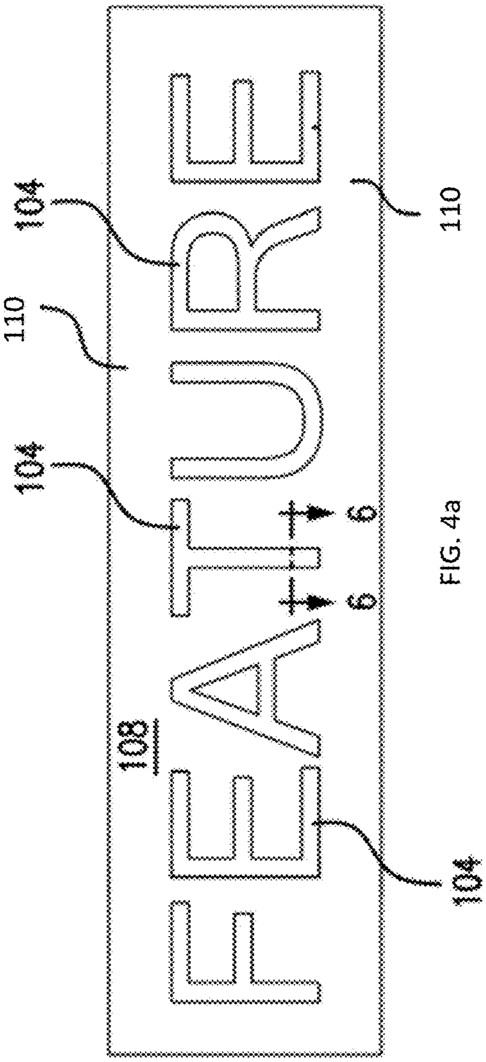
FIG. 4*a* is a top view of an example of a multi-component block.

FIG. 4*a* is a top view of an example of a multi-component block. The illustrated block includes a body 110 (an example of a main body portion 110) formed of the SiC containing material 20 illustrated in FIG. 3*a*, and discrete, spaced-apart features 104 formed of the diamond-containing material illustrated in FIG. 3*c*. The features 104 may be located in corresponding trenches 106 (examples of surface features, FIG. 4*b*) that are laser machined into the top surface 108 of the SiC-containing body 102. In the illustrated example, each feature 104 may have a width W in a range of from 0.5 mm to 3.0 mm, preferably about 1.2 mm, and a depth D in a range of from 100 μm to 600 μm, preferably about 300 μm, and the trenches 106 may be at least partially filled with a suitable amount, such as nominally 65 μm, of diamond powder. The present disclosure should not be limited, however, to the details of the examples described herein.

Then, after the trenches 106 are filled with diamond powder, molten Si is simultaneously infiltrated into the body 110 and the trenches 106 to create the material 20 illustrated in FIG. 3*a*, with reaction-bonded SiC 24 (FIG. 4*c*), in the body 110, and to create the diamond-containing material 40 within the trenches 106 (and only in the trenches 106). As a result, the multi-component block can use the discrete features 104 to provide the high-performance characteristics associated with the diamond-containing material 40 only where desired, while the remainder of the block 100 (that is, the body 110) contains reaction-formed SiC but no diamond and therefore may be more easily machined.

In other words, the illustrated multi-component block may have hard, thermally-conductive diamond-reinforced composite material 40 where needed (and only where needed), and reaction-bonded SiC 20 (without diamond) in other areas for ease of machining. The body 110 and the features 104 illustrated in FIG. 4*a* represent one example of a wide variety of applications where local diamond-containing reinforcement may have value, such as where very hard, low-friction material is desired only at a particular location of a component where wear would otherwise occur, or to provide thermally stable, very high thermal conductivity pathways only where heat sinking and/or heat spreading are required, or to provide very stiff (i.e., high Young's modulus) regions only where low mechanical deflection is desired.

In the illustrated example, the reactions that occur in the trenches 106, which involve Si+diamond, are different from the reactions that occur simultaneously elsewhere in the body 110, which involve Si+carbon but no diamond. As a result, the residual elemental Si content in the diamond-reinforced region (within the trenches 106) is lower than in the rest of the block. For example, the residual elemental Si in the diamond-reinforced region within the trenches 106 may be about 6.8%, for example, while the residual Si in the SiSiC (and no diamond) region may be about 23.2%, for example.

The lower residual Si content in the diamond-reinforced region may yield improved properties (hardness, stiffness, inertness, etc.), but the combination of diamond particles and low elemental Si content may make machining especially difficult, such that it may be especially advantageous to locate the diamond-containing features 104 only where needed. However, avoiding difficult machining is only one of many reasons why localizing diamond-containing features may be advantageous. Another advantage of providing diamond reinforcement only where it can be put to effective use is reduced cost. In other words, it is advantageous to use high-cost diamond powder only where it is needed.

Figure 5:
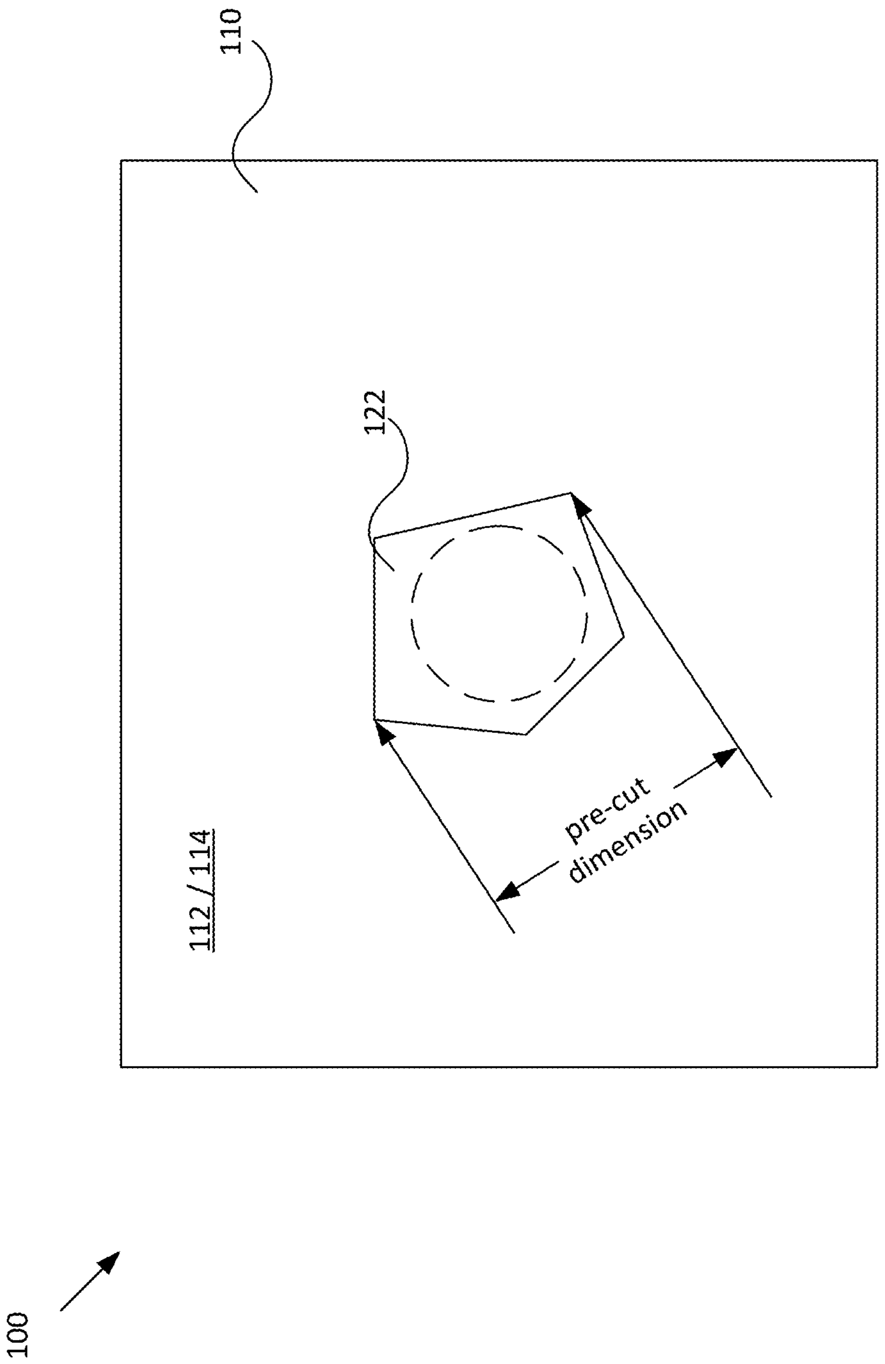
FIG. 5 illustrates an exemplary reaction-bonded silicon carbide body 100 using a single diamond particle 122 for a discrete element 120, before machining.

FIG. 5 illustrates an exemplary reaction-bonded silicon carbide body 100 using a single diamond particle 122 for a discrete element 120, before machining. There is shown a reaction-bonded silicon carbide body 100 comprising a main body portion 110, wherein the main body portion 110 comprises a single diamond particle 122, reaction-bonded silicon carbide 112, and elemental silicon 114. The main body portion 110 does not contain diamond other than the diamond particle 122.

Figure 4B:
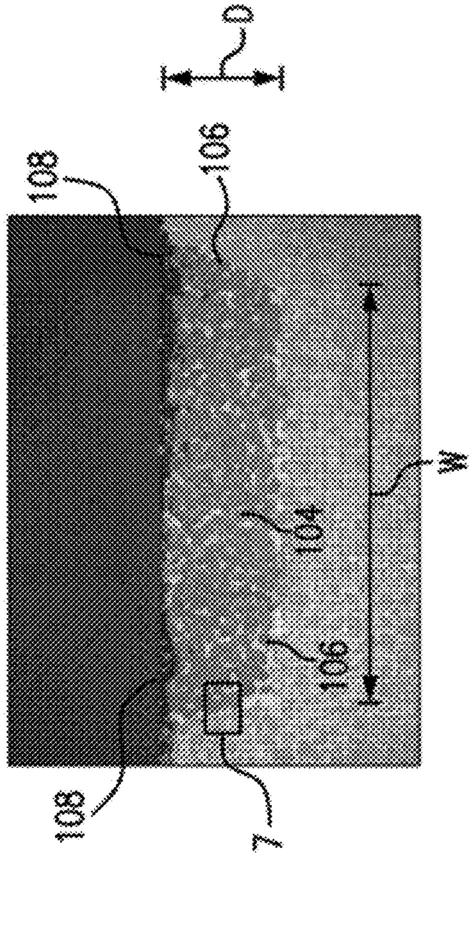
FIGS. 4*b* and 4*c* illustrate exemplary details of FIG. 4*a*.
Figure 4C:
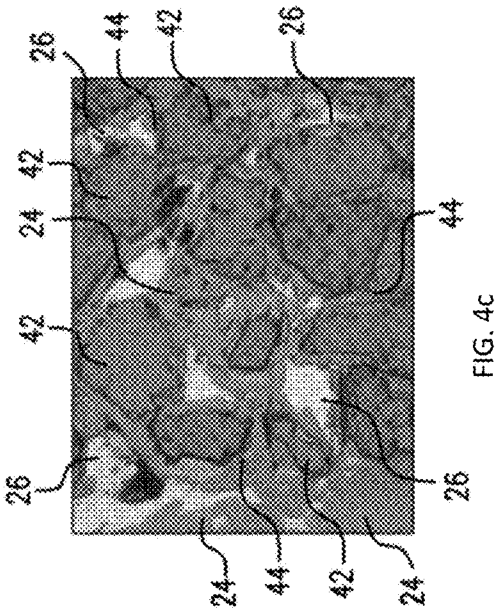

In accordance with various embodiments of the present disclosure, it may be desirable to generate features e.g., features 104 comprising not diamond powder but a single diamond particle 122 instead. Again, the main body portion 110 does not comprise diamond other than particle 122. The diamond particle 122 may be of a significantly larger dimension than diamond particles used in powder form as illustrated in FIGS. 4*a* to 4*c*. The diamond particle 122 may have a dimension of 600 μm, for example. The diamond particle 122 may thus be embedded in the main body portion 110.

In accordance with various embodiments of the present disclosure, it may be desirable to generate features from the diamond particle 122. For example, it may be desirable to form e.g., a round pin with a solid diamond surface from the diamond particle 122, along the dashed line, that may eventually stand proud, as shown in FIG. 6.

Figure 6:
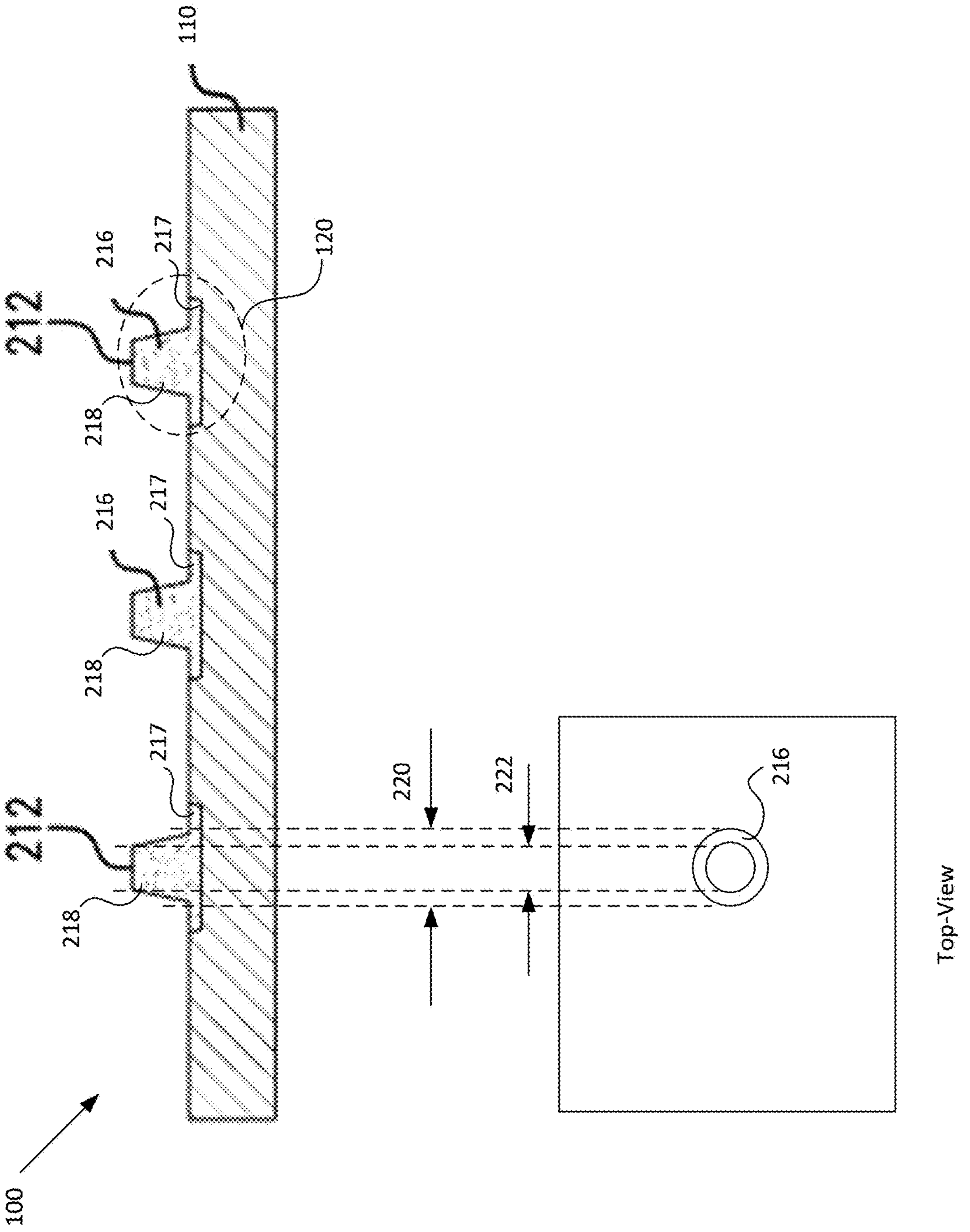
FIG. 6 illustrates a cross-section and a top view of a reaction-bonded silicon carbide body, after machining.

FIG. 6 illustrates a cross-section and a top view of a reaction-bonded silicon carbide body 100, after machining. There is shown a reaction-bonded silicon carbide body 100, a main body portion 110. There are shown discrete elements 120, comprising pins 216. The pins 216 may be formed from a single diamond particle 122 through machining. The pins 216 comprise a first portion 217 located in the main body portion 110 and a second portion 218 that may stand proud of the surface of the main body portion 110. The pins 216 may comprise a top surface 212. The pins 216 may be, for example, of a conical frustrum shape with a first base diameter 220 and a second smaller diameter 222. In accordance with various embodiments of the present disclosure, the pins 216 may be any suitable shape, for example triangular or square or pentagonal frustrums. The frustrums may, in some embodiments, approach or even become substantially cylindrical. In some embodiments, the shape of the pins 216 may comprise multiple stacked frustrums, or the shape may be approximated by an arbitrary number of stacked frustrums. The diameter of the pins 216, due to the often slightly conical shape, may be of a nominal dimension, that may be considered equal to the first diameter 220, the second diameter 222, or somewhere between the first diameter 220 and the second diameter 222, for example.

A structure, for example pin 216, as shown in FIG. 6, may be machined from a single diamond particle 122 embedded in a main body portion 110 (FIG. 5), comprising reaction bonded silicon carbide 112 and elemental silicon 114, for example. The machining may comprise simple surface grinding to produce a common top surface, that may produce flat top surfaces 212 of the pins 216 later. More of the main body portion 110 may then be machined away, to form the pins 216 and to make them stand proud above the top surface of the main body portion 110. Suitable machining may be laser cutting. The pins 216 may therefore be discrete elements of a dimension, a diameter, that may be partly located within the main body portion 110. If the diameters of the diamond containing pins 216 may be, for example, in the range of from 200 μm to 800 μm, preferably about 400 μm. The heights of the pins 216 may likewise be in the range of from 200 μm to 800 μm, preferably about 400 μm, but these are just examples of how the present disclosure may be implemented. The present disclosure should not be limited to the details of the examples described herein.

Figure 7:
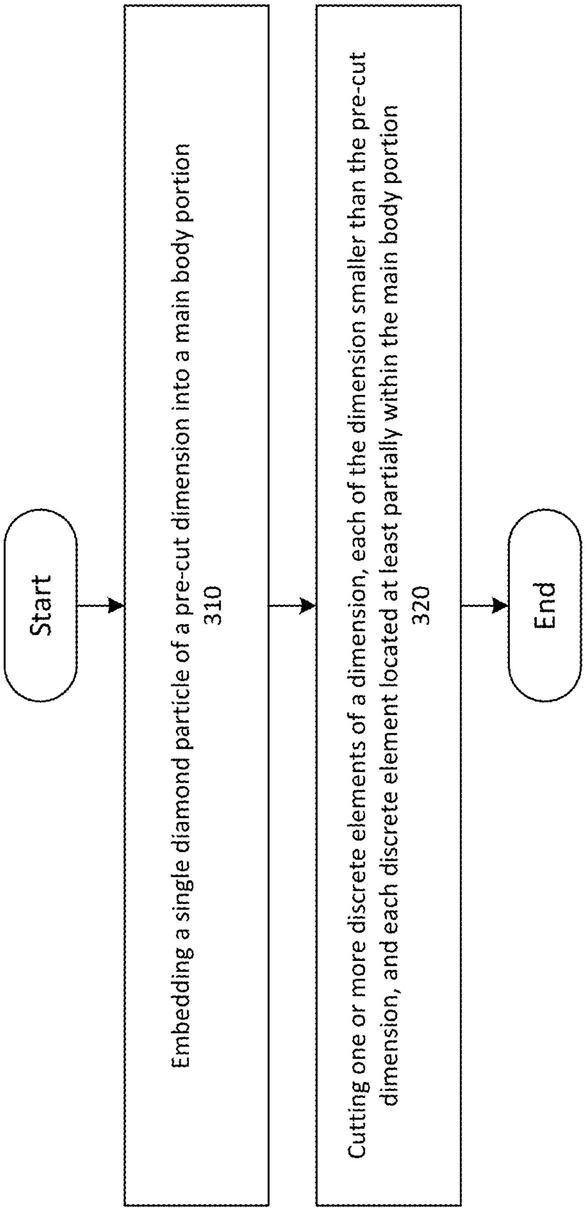
FIG. 7 is a flowchart that describes a method, according to some embodiments of the present disclosure.

FIG. 7 is a flowchart that describes a method, according to some embodiments of the present disclosure. In some embodiments, at 310, the method may comprise embedding a single diamond particle 122 of a pre-cut dimension into a main body portion 110 (see also FIG. 5). At 320, the method may comprise cutting one or more discrete elements 120 of a dimension, each of the dimension smaller than the pre-cut dimension, and each discrete element 120 located at least partially within the main body portion 110. The main body portion 110 may comprise reaction-bonded silicon carbide 112, elemental silicon 114, and does not comprise diamond outside of the discrete elements, e.g., particles 122. Each of the discrete elements 120, e.g., pins 216, may comprise a single diamond particle 122 of a post-cut dimension.

In accordance with various embodiments of the present disclosure, the method may comprise cutting one or more discrete elements 120 of a dimension, each of the dimensions smaller than the pre-cut dimensions, and each of the discrete elements 120 located at least partially within the main body portion 110, and wherein each of the discrete elements 120 comprises a single diamond particle 122 of the dimension.

In some embodiments, the method may include configuring the main body portion 110 for use within a vacuum wafer chuck. In some embodiments, the method may include configuring the discrete elements 120, e.g., pins 216, to provide high heat flux directly under a die, without reducing the machinability of the main body portion 110. In some embodiments, the method may include configuring the discrete elements 120 to provide local diamond reinforcement at a wear face (e.g., top surface 212), without reducing the machinability of the main body portion 110.

In some embodiments, the method may include cutting the discrete elements 120 to form pins 216 for supporting a semiconductor wafer. In some embodiments, the method may include forming the pins 216 to comprise a first portion 217 located within the main body portion 110, and the pins 216 to stand proud above the main body portion 110. The pins may, as in FIG. 6, comprise a first portion 217 with a first diameter 220 and a second portion 218 with a second diameter 222. In some embodiments the first diameter may be greater or equal than the second diameter, the second diameter being substantially equal to the dimension, for example.

In some embodiments, the method may include forming the pins such that they may be separated from each other to prevent bi-metallic strip stresses.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A reaction-bonded silicon carbide body, comprising:

a main body portion, comprising reaction-bonded silicon carbide and elemental silicon, and not comprising diamond; and one or more discrete elements, each having a defined dimension and being spatially separated from one another, each located at least partially within the main body portion, and each comprising exactly one diamond particle of the dimension, reaction-bonded silicon carbide coatings fully surrounding the diamond particles, and elemental silicon.

2. The reaction-bonded silicon carbide body of claim 1, wherein the main body portion is configured for use within a vacuum wafer chuck.

3. The reaction-bonded silicon carbide body of claim 1, wherein the discrete elements comprise pins for supporting a semiconductor wafer.

4. The reaction-bonded silicon carbide body of claim 3, wherein the pins comprise first portions located within the main body portion, and the pins comprise second portions which stand proud above the main body portion and the first portions.

5. The reaction-bonded silicon carbide body of claim 4, wherein the first portions of the pins have a first diameter, the second portions of the pins have a second diameter, and the first diameter is greater than the second diameter, the second diameter being substantially equal to a dimension.

6. The reaction-bonded silicon carbide body of claim 3, wherein the pins are separated from each other to prevent bi-metallic strip stresses.

7. The reaction-bonded silicon carbide body of claim 1, wherein the discrete elements are configured to provide high heat flux directly under a die, without reducing the machinability of the main body portion.

8. The reaction-bonded silicon carbide body of claim 1, wherein the discrete elements are configured to provide local diamond reinforcement at a wear face, without reducing the machinability of the main body portion.

9. The reaction-bonded silicon carbide body of claim 1, wherein the single diamond particle may comprise a single crystal or a polycrystalline crystal.

* * * * *